United States Patent [19]

Neumann et al.

[11] 4,029,999
[45] June 14, 1977

[54] THERMALLY CONDUCTING ELASTOMERIC DEVICE

[75] Inventors: Edward William Neumann; Edward John Rabenda, Jr., both of Poughkeepsie, N.Y.

[73] Assignee: IBM Corporation, Armonk, N.Y.

[22] Filed: Apr. 10, 1975

[21] Appl. No.: 566,853

[52] U.S. Cl. .................................. 361/386; 361/400
[51] Int. Cl.² .......................................... H05K 7/20
[58] Field of Search .................. 174/52 PE, 16 HS; 317/100, 101 CC

[56] References Cited
UNITED STATES PATENTS

| | | | |
|---|---|---|---|
| 2,881,364 | 4/1959 | Demer et al. | 317/100 |
| 3,087,982 | 4/1963 | Hayes | 174/35 TS |
| 3,579,821 | 5/1971 | Kurisu | 317/100 |
| 3,616,533 | 11/1971 | Heap et al. | 317/100 |

Primary Examiner—Gerald P. Tolin
Attorney, Agent, or Firm—W. S. Robertson

[57] ABSTRACT

A thermally conducting cushion-like elastomeric pad of RTV (Room Temperature Vulcanized) silicone rubber moled with indentations in one surface to fit in glove-like relationship with electronic components situated on a component carrying card, the opposite surface mounted flush with a heat sink such that the heat generated by the electronic components is transferred through the pad to the heat sink.

3 Claims, 2 Drawing Figures

U.S. Patent June 14, 1977 4,029,999
FIG. 1
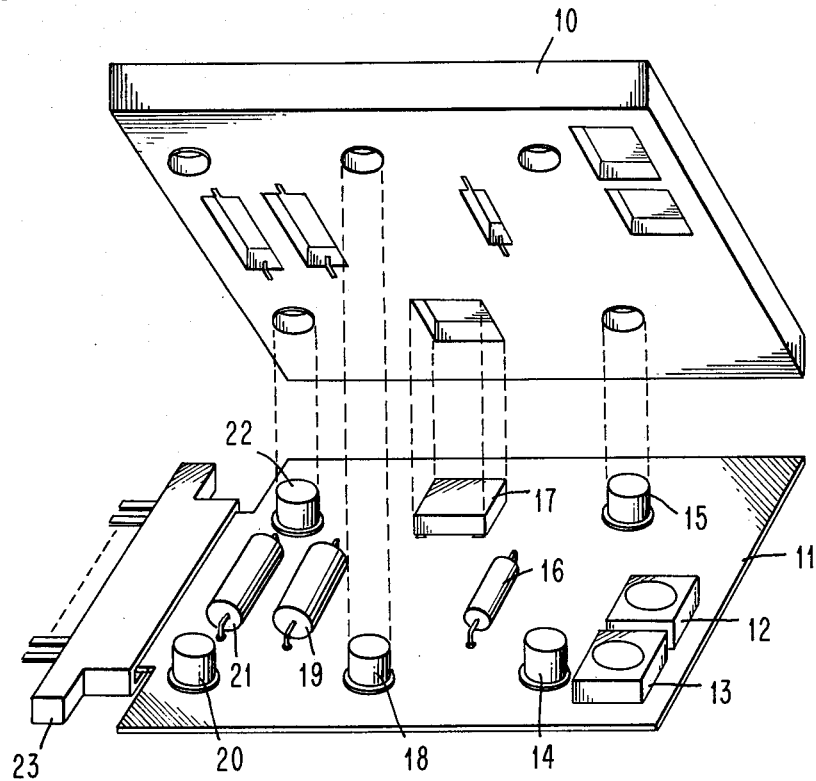
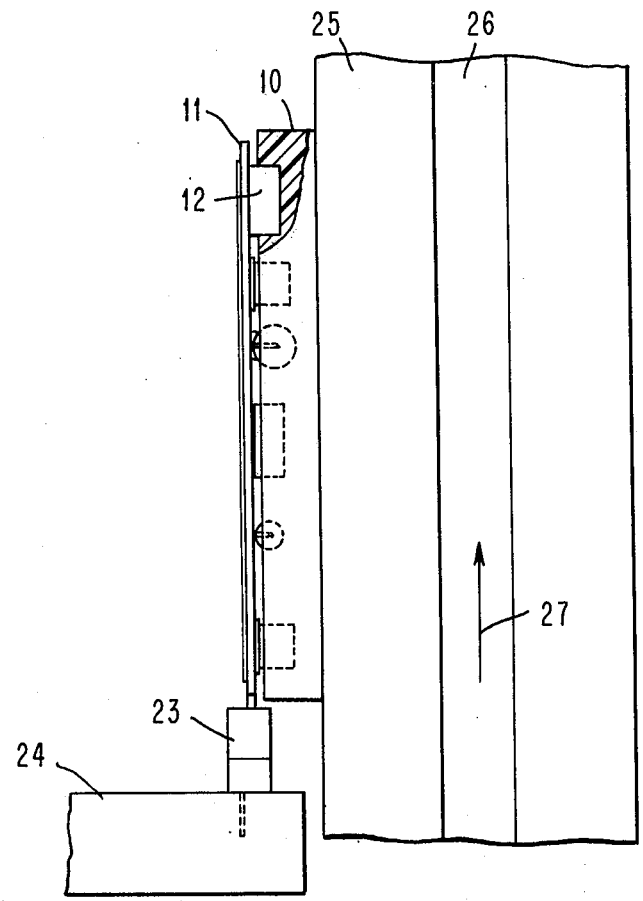
FIG. 2

THERMALLY CONDUCTING ELASTOMERIC DEVICE

This invention relates to a heat transfer device and more particularly to a reuseable heat coupling cushion for transferring heat from heat producing components to a heat sink component.

BACKGROUND OF THE INVENTION

In the electronic industry much use is made of circuit boards or cards one side of which carries a number of components mounted thereon and the other side of which carries the wiring which interconnects the various components into circuits. Many of the electrical components which may be mounted on such cards are heat sensitive and will not perform properly or will not last for a sufficient life span unless they can be kept cool. In many applications cool air is blown across the surface of the cards in order to dissipate heat, however, as components become smaller enabling higher component density on the cards, and as power requirements for various components become larger, that type of cooling in many cases becomes impractical.

Liquid cooling of electronic components provides many problems which are difficult to resolve. For example, if the cooling liquid is placed directly on the component board, it would short out the electrical connections on the board unless the liquid were absolutely non-conducting. Since it is virtually impossible to prevent contaminations from entering the cooling liquid, it is virtually impossible to prevent a short circuiting of components if the liquid is directly applied. Consequently, techniques have been developed whereby the cooling fluid (liquid or gas) is channeled through a heat sinking component which is placed near the electrical components which are to be cooled. The problem then is to couple the electrical components to the heat sink. At present, potting compounds are generally used for such coupling, the compounds covering the entirety of the surface of the card and all components thereon and are built up to come into intimate contact with the surface of the heat sink. Such potting compounds are not reuseable since they become part of the card itself. Unfortunately, they also tend to contaminate or short out components on the card or otherwise occasionally cause electrical difficulties thereon. Therefore, it is the general object of this invention to provide a cushioning heat transfer pad which will provide intimate contact with each of the components mounted on a circuit board and a heat sink. It is another object of the invention that the coupling pad be reuseable so that as cards are replaced in normal maintenance of a device, the heat transfer pad can be reused from card to card. Further objects include non-contamination and non-shorting of electrical components; economical, easily produced, non-toxic material; must not produce harmful gases at elevated temperatures; must not degrade at continuous operating temperatures; and should be somewhat elastic to allow for variations in component locations from card to card.

SUMMARY OF THE INVENTION

This invention is a thermally conducting cushion-like pad of elastomeric material for use with heat dissipating devices of various shapes and sizes wherein each of the shapes and sizes appear as indentations in the thermally conducting pad so that when the pad and the devices are brought into contacting relationship the pad fits over the devices in glove-like relationship. The pad is comprised of elastomeric material so that it stretches to fit minor variations in component placement from card to card.

BRIEF DESCRIPTION OF THE DRAWINGS

The foregoing and other objects, features and advantages of the invention will be apparent from the following detailed description of a preferred embodiment of the invention as illustrated in the accompanying drawings wherein:

FIG. 1 shows an exploded view of a component carrying card together with the elastomeric thermal conducting pad of the invention.

FIG. 2 shows the component carrying card and the thermal pad in assembly with the card mounted in a connector and the thermal pad in juxtaposition with a heat sink component.

DETAILED DESCRIPTION OF AN EMBODIMENT

FIG. 1 shows an embodiment of the thermally conducting pad 10 of the invention in an exploded view with an electrical component carrying card 11. Electrical components of various shapes and sizes 12 through 22 are shown mounted on card 11. These components may be resistors, capacitors, transistors, integrated circuit chips, inductors, transformers or any component normally mounted on a card. A mail connector 23 is shown for providing circuit connections to the components on the card when the card is inserted into a mount. Note that the specific outlines of each of the electrical components on call 11 are reproduced as indentations in thermal pad 10. Thus, the round raised shape of component 15 is found as a round cylindrical indentation of similar proportion in thermal pad 10 while the square raised shape of component 17 is found as a square indentation of similar proportion in the thermal pad 10. As a result when pad 10 is brought down and pressed onto the surface of component carring card 11 each of the components will fit into a corresponding indentation in thermal pad 10 to provide a glove-like relationship between the pad and the components. The elastomeric nature of the material used in pad 10 allows for a stretching of the pad so that even if small eccentricities exist between the position of the indentation in the pad and the placement of the component on the card, that eccentricity will not create a misfit which would prevent a close juxtaposition of the pad on the componenty of the entire card. The elastomeric nature of the pad also aids in obtaining a good glove-like fit of component to pad.

The assembled relation of the component carrying card 11 and the pad 10 is shown in FIG. 2 with card 11 mounted in a female connector mount 24. The pad 10 abuts a heat sink 25 in which a channel 26 has been provided for carrying a coolant. The heat sink 25 has a flat surface to which is matched a corresponding flat surface of pad 10. The arrow 27 indicates the direction in which a coolant may flow in the channel although the direction of such coolant flow is arbitrary. Note that the pad is of sufficient thickness to completely encase the indentation.

Thus, an arrangement has been provided wherein heat from heat-producing components on a component carrying card is transferred to a heat sink through an elastomeric pad of thermally conducting material that can be stretched to provide a glove-like relationship with each of the heat-producing components despite minor variations in component placement from card to card.

It is thought that one of the more important uses of the invention will be with circuit cards in power supply units where heat dissipation problems are normally most severe. However, the invention can be used wherever it is desired to obtain good thermal flow between heat producing components and a heat sink. One of the most important features of the invention is that the pad itself is a product apart from the card. In most previous arrangements potting compounds have been used which are placed in flowable form upon the surface of the card and which become a part of the card thereafter. As a result it is difficult to change components on the card and in any event if the card is replaced the cooling component is replaced along with it. In the invention described herein, the pad is a separate unit which is not discarded when a card is replaced but rather is used again with the new card. Thus, a savings is realized while at the same time, because of the elastomeric nature of the pad, any variations in component placements from card to card are not critical. It would also be possible, should an additional component be placed on the card as an engineering change, for a maintenance man to carve out the shape of the new component on the interior surface of the thermal pad with a knife, thus, extending the life of the thermal pad even in those circumstances.

While there may be several manners of producing the card, the preferred manner known to the inventors at the time is to produce a metal positive in which the component shapes are reproduced and then using the metal positive to produce the pad in a molding operation.

Although any relatively good heat transfer material may be used to provide the thermal pad of the invention, the best known material to the inventor is an elastomeric silicone rubber such as RTV (Room Temperature Vulcanized) silicone rubber with high thermal conductivity.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A device for heat transfer including heat producing electrical components of differing shapes mounted on a circuit card, a heat sink component through which said heat is to be dissipated,
   a pad of a stretchable, elastomeric, thermally conducting, material,
   said pad having first and second opposite surfaces, said second surface having multiple indentations each in the shape of the corresponding component on the card and replaceably fitting in glove-like relationship to the exterior of each component on said card to provide a snug interface for heat transfer from the components to the pad, and
   said pad first surface contacting said heat sink component whereby said pad provides a thermal path from the heat-producing components to the heat sink component.

2. The device of claim 1 wherein said pad is of sufficient thickness to completely form an indentation of the exterior shape of even the largest component on said card.

3. The device of claim 2 wherein said first surface is substantially flat for intimate contact with a corresponding flat surface of said heat sink component.

* * * * *